(12) United States Patent
Cohen et al.

(10) Patent No.: US 6,628,173 B2
(45) Date of Patent: Sep. 30, 2003

(54) DATA AND CLOCK EXTRACTOR WITH IMPROVED LINEARITY

(75) Inventors: Avraham (Avi) Cohen, Ra'anana (IL); Yaron Slezak, Ra'anana (IL)

(73) Assignee: Conexant Systems, Inc., Newport Beach, CA (US)

( * ) Notice: Subject to any disclaimer, the term of this patent is extended or adjusted under 35 U.S.C. 154(b) by 68 days.

(21) Appl. No.: 10/026,190

(22) Filed: Dec. 20, 2001

(65) Prior Publication Data

US 2003/0118209 A1 Jun. 26, 2003

(51) Int. Cl.[7] .................................................. H03L 7/00
(52) U.S. Cl. .................... 331/25; 331/1 A; 331/DIG. 2; 375/130; 375/293; 327/160; 327/98; 360/51
(58) Field of Search ............................. 331/25, DIG. 2, 331/1 A, 117 R; 375/130, 293, 371; 327/98, 160; 360/51

(56) References Cited

U.S. PATENT DOCUMENTS

| | | | | |
|---|---|---|---|---|
| 4,726,022 A | * | 2/1988 | Chan et al. ................. | 714/704 |
| 4,972,161 A | * | 11/1990 | Davies et al. ................ | 331/1 A |
| 5,297,173 A | * | 3/1994 | Hikmet et al. .............. | 375/371 |
| 5,592,113 A | * | 1/1997 | Quiet et al. .................. | 327/158 |
| 6,300,838 B1 | * | 10/2001 | Kelkar ......................... | 331/17 |
| 6,347,128 B1 | * | 2/2002 | Ransijn ....................... | 375/376 |
| 6,421,404 B1 | * | 7/2002 | Nakamura ................... | 375/354 |

* cited by examiner

Primary Examiner—Robert Pascal
Assistant Examiner—Joseph Chang
(74) Attorney, Agent, or Firm—Jack I. J'maev

(57) ABSTRACT

Phase-locked-loop based data and clock extraction comprising a phase detector that generates up and down pulses. Down pulses are maintained in width approximately equal to 1.5 unit intervals of a local sampling clock. Up pulses are allowed to vary with the phase relationship between the local sampling clock and an incoming encoded bit stream. The up pulses are allowed to vary between 1 and 2 unit intervals of the local sampling clock. The up and down pulses drive a charge pump D/A converter that generates a control voltage. The control voltage sets the frequency of the local sampling clock generated by a voltage controlled oscillator. Shift register controlled by a state machine and clocked by the local clock allows reception of complex data packets arriving by the encoded bit stream.

17 Claims, 8 Drawing Sheets

GENERATION OF UP SIGNAL

DATA AND CLOCK EXTRACTOR WITH IMPROVED LINEARITY

FIELD OF THE INVENTION

This invention relates generally to extraction devices that recover a clocking signal from an encoded data signal.

BACKGROUND OF THE INVENTION

Serial communications is an extremely popular technique for transmitting data from one point to another. Typically, serial data is transmitted either as an asynchronous bit-stream or it may be accompanied by a separate clocking signal that defines the temporal location of each data bit in the stream. This latter type of transmission is known as synchronous serial data.

As serial data rates are increased, use of asynchronous data transmission becomes problematic because recovery of the data bits in the stream cannot be performed reliably. This is because the sampling clock is not synchronous with the transmitting clock. For this reason, use of synchronous data transmission is more appropriate at higher data rates. One drawback associated with the use of synchronous transmission is the fact that a separate clocking signal must be provided alongside the data stream.

Other techniques for transmitting serial data in a synchronous manner incorporate clocking information into the serial data stream. Such synchronous coding schemes guarantee a minimum number of the data state transitions within a given period of time. Furthermore, such encoding techniques guarantee that state transitions within the encoded data stream will be synchronous with a clocking mechanism that created the data stream. Manchester encoding and 4-of-5 encoding are two examples of such encoding techniques that incorporate clocking information in the data bit stream.

Most high-speed network protocols are based on such encoding techniques. This allows a single medium to carry high-speed data and clocking information. The clocking information is inherent in the encoding scheme. In a typical network structure, a media access controller (MAC) comprises a data and clock extraction mechanism. The data and clock extraction mechanism may typically comprise a local oscillator. The local oscillator may be synchronized to the state transitions exhibited by an incoming data bit stream.

Synchronization of the local oscillator may typically be accomplished by comparing the phase of the local oscillator clock to the phase of the state transitions exhibited by the incoming bit-stream. In many cases, the difference in phase between the incoming bit stream and the local oscillator may be used to adjust the frequency of the local oscillator in a continuous feedback structure. The feedback structure is aimed at driving the difference between the phases to negligible levels. This type of a structure is commonly referred to as a phase-locked-loop (PLL).

A typical PLL structure comprises an element called a phase detector. The phase detector receives an encoded bit stream along with a local clock signal.

The local clock may typically be generated by a voltage-controlled-oscillator (VCO) that further comprises the PLL structure. In most PLL structures, the phase detector generates pulses that indicate if the phase of the VCO generated local clock leads or lags the phase of the incoming bit stream transitions. Typically, these pulses are referred to as "up" pulses and "down" pulses. A typical PLL structure may further comprise a digital-to-analog (D/A) converter. In some cases, the D/A converter may be a charge-pump converter. This type of converter typically generates a voltage that is proportional to the ratio of the widths of the up and down pulses received from the phase detector.

In some PLL implementations, the phase detector typically generates a down pulse that is of a constant duration, i.e. width. Typically, the pulse width of the down pulse is maintained at ½ of a cycle of the local clock. In order to vary the voltage generated by the charge-pump, a typical phase detector may vary the width of the up pulses between zero and one cycle of the local clock. The width of one cycle of the local clock is typically referred to as a "unit-interval" (UI). Hence, the down pulse is typically maintained at 0.5UI and the up pulses may vary between 0 and 1UI.

One disadvantage in varying the pulse width of the up pulse from 0UI to 1UI is that as the PLL begins to converge, the width of the up pulse may be driven to zero. As the width of the up pulse diminishes, a charge-pump D/A converter will experience difficulty in distinguishing the actual width of the up pulse. This typically manifests in poor linearity in the D/A conversion process. Poor linearity in the D/A conversion results in poor jitter characteristics. This ultimately limits the speed at which data and clock can be extracted from an encoded data bit stream.

SUMMARY OF THE INVENTION

The present invention comprises a method for extracting clock and data that may be operated at higher frequencies than known methods. The present method comprises generation of a local sampling clock that may be used to recover data from an incoming encoded bit stream. This local sampling clock is typically developed asynchronously from the incoming encoded bit stream. This method teaches a novel method of comparing the phase of the locally generated sampling clock to the phase of state transitions exhibited by the incoming encoded data stream.

According to this illustrative method, this phase comparison results in the creation of "up" and "down" pulses. According to the invention, down pulses may be maintained in width approximately equal to 1.5 unit intervals of the local sampling clock. The up pulses may be allowed to vary in width between 1 UI and 2 UIs. By preventing the width of the up pulse from approaching zero, the linearity of the phase comparison may be greatly enhanced. Hence, the scope of the present invention should not be limited to methods where down pulses are maintained at 1.5 UI and up pulses varied between 1 and 2 UI. Rather, the present invention includes those embodiments where the width of either the down or up pulse is not allowed to approach a small time periods so as to adversely affect the linearity of phase detection and control of the frequency of a local oscillator.

The phase difference may be expressed by the ratio of the width of the down pulses to the width of the up pulses. According to one example method, the frequency of the local sampling clock may be adjusted according to the ratio expressing the phase difference.

In some embodiments of this illustrative method, the step of creating down pulses may be accomplished by sampling the incoming encoded bit stream coincident with the locally generated sampling clock. The sampled value may be inverted and then delayed before it is sampled with the inverse of the locally generated sampling clock. The amount of delay introduced before sampling with the inverse of the locally generated sampling clock should be sufficient to allow for the sampling of this signal after the first incidence of the inverse of the local clock that occurs after the incidence of the local clock used to sample the encoded bit stream. The down pulses may then be created by logically ANDing the sampled encoded bit stream with the sampled delayed inverse of the sampled encoded bit stream.

This illustrative method for extracting clock and data from an encoded bit stream provides for the creation of up pulses by first sampling the incoming encoded bit stream coincident with the local sampling clock. The sampled value may again be sampled with the local sampling clock. This generates a twice-sampled encoded bit stream. The inverse of this twice-sampled encoded bit stream may then be logically ANDed with a delayed version of the encoded bit stream. The amount of delay introduced into the encoded bit stream prior to the logical AND function should be approximately equivalent to the time necessary for the state of the twice-sampled encoded bit stream to stabilize.

The invention further comprises a phase-locked-loop that embodies the method of the present invention. Accordingly, the PLL comprises a phase detector that receives an incoming encoded data stream and a locally generated sampling clock. The phase detector generates up and down pulses characteristic of the method described herein. Hence, the phase detector may generate down pulses that are maintained in width approximately equal to 1.5 UIs of the local sampling clock. Likewise, the phase detector may generate up pulses that are allowed to vary in width between 1 UI and 2 UIs of the local sampling clock. Again, the key characteristic of the up and down pulses is that they not be allowed to diminish in width below a critical value where the linearity of phase comparison is adversely affected.

According to one example embodiment, the PLL may further comprise a digital to analog converter capable of generating a control voltage based on the ratio of the widths of the up and down pulses generated by the phase detector. The PLL may further comprise a voltage-controlled oscillator that generates the local sampling clock at a frequency dictated by the control voltage.

In some embodiments of the present invention, the PLL may further comprise a phase detector that comprises a down pulse generator. In these embodiments, the down pulse generator may comprise a first sampling unit that saves the state of the encoded data signal coincident with the local sampling clock. A delay unit further comprises the down pulse generator and delays the inverse of the state saved by this first sampling. The delay unit delays the inverse of the state saved by the first sampling unit beyond the first incidence of the inverse of the local sampling clock that occurs after the incidence of the local sampling clock used to save the state of the encoded bit stream.

The down pulse generator further comprises a second sampling unit that saves the state of the delayed inverse of the state saved by the first sampling unit. This second sampling unit saves the state of its input coincident with the inverse of the local sampling clock. The down pulse generator further comprises an AND gate that generates a down pulse by logically ANDing the state of the encoded bit stream saved by the first sampling unit with the state of the delayed inverse of the sampled encoded bit stream saved by the second sampling unit.

Some embodiments of the PLL may comprise a phase detector that comprises an up pulse generator. According to these example embodiments, the up pulse may be generated by twice-sampling the state of the encoded data signal coincident with the local clock. A delayed version of the encoded data signal may then be logically ANDed with the inverse of the twice-sampled encoded data signal in order to generate the up pulses.

The state of the encoded data signal may be twice-sampled by a first sampling unit that saves the state of the encoded data signal and a second sampling unit that saves the state saved by the first sampling unit. The first and second sampling units that comprise the up pulse generator sample the state of their inputs coincident with the local sampling clock.

The up pulse generator may further comprise a delay unit that delays the encoded data signal by an amount of time approximately equal to the time necessary for the output of second sampling unit to stabilize. The delayed version of the encoded data signal may then be logically ANDed with the inverse of the twice-sampled encoded data signal by an AND gate that further comprises the up pulse generator. The output of the AND gate comprises a signal that carries the up pulses.

The present invention may further comprise a data and clock extraction unit. The data and clock extraction unit comprises a PLL that embodies the method of the present invention and a data sampling unit that saves the state of an incoming encoded bit stream coincident with the sampling clock generated by the PLL. Each sample of the encoded bit stream yields a single bit of incoming data.

In some embodiments, the data and clock extraction unit may further comprise a data reconstruction unit. The data reconstruction unit may receive a plurality of data bits from the data sampling unit and creates data packets comprising some defined plurality of data bits. In one illustrative embodiment, the data reconstruction unit may comprise a state machine to control acquisition of data bits and a shift register that collects data bits at the direction of the state machine.

In some example embodiments, the state machine may comprise a start detector and a length counter. In these embodiments, the start detector receives a stream of data bits from the data sampling unit and searches for a data packet start indicator in the bit stream. Once the data packet start indicator is recognized, the start detector may assert an acquisition signal. The length counter may de-assert the acquisition signal after a predetermined number of bits are received. In these embodiments, the shift register may store incoming data bits so long as the acquisition signal is active.

In another embodiment of a data and clock extraction unit, the state machine may further comprise an address comparison unit. The address comparison unit typically accepts an address field from the shift register and asserts a data ready signal if the address acquired in the shift register matches one or more predefined addresses.

BRIEF DESCRIPTION OF THE DRAWINGS

The foregoing aspects are better understood from the following detailed description of one embodiment of the invention with reference to the drawings, in which.

DETAILED DESCRIPTION OF THE INVENTION

Figure 1:
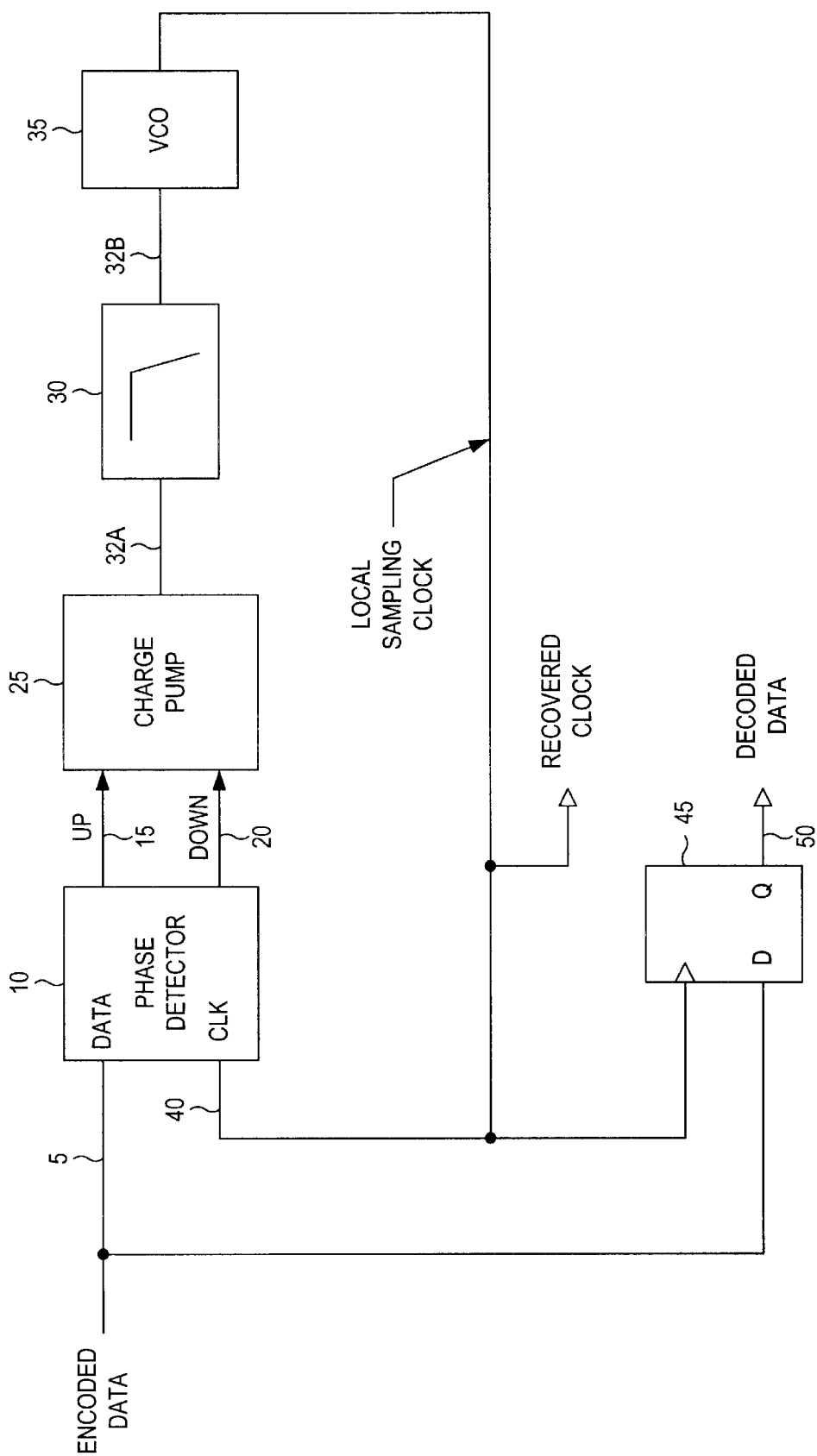
FIG. 1 is a block diagram of a phase-locked-loop according to one example embodiment of the present invention.

FIG. 1 is a block diagram of a phase-locked-loop according to one example embodiment of the present invention. According to this example embodiment, the PLL comprises a phase detector 10 and a voltage controlled oscillator (VCO) 35. The PLL may further comprise a digital-to-analog (D/A) converter 25. The PLL may also further comprise a filter 30.

In operation, the phase detector 10 receives an encoded data signal 5. The encoded data signal may exhibit state transitions indicative of a data bit stream that is encoded therein. These state transitions are also typically an inherent indication of the clock signal used to impart a data bit stream onto the encoded signal. The VCO generates a local clock 40 based on a control voltage 32. The local clock 40 is also received by the phase detector 10. The phase detector 10 determines the phase of the local clock 40 relative to the phase of the state transitions exhibited by the encoded data signal 5.

Based on this relative phase comparison, the phase detector 10 creates two streams of pulses. The first pulse stream is an "up" pulse stream 15. The second pulse stream is a "down" pulse stream 20. According to this example embodiment of the present invention, the phase detector may create down pulses 15 that are approximately equal in width to 1.5 unit intervals (UI) of the local sampling clock 40. Also according to this example embodiment, the phase detector 10 may create up pulses 20 that may vary in width from 1 UI to 2 UIs. In this example embodiment, the ratio of the width of the down pulses 20 to the width of the up pulses 15 may be indicative of the phase relationship of the local sampling clock 40 and the encoded data signal 5 received by the phase detector 10.

In one example embodiment, the up and down pulses may be used to drive a D/A converter that may also comprise the PLL. In some example embodiments, the D/A converter may be a charge pump 25. The charge pump 25 typically converts the up and down pulses to a voltage level 32A. According to this example embodiment, the charge pump 25 renders a control voltage 32A that is proportional to the ratio of the width of the down pulse to the width of an up pulse. In those example embodiments where the PLL comprises a filter 30, the control voltage 32A is filtered by the filter 30 to provide a bandwidth limited control voltage 32B. The purpose of the filter 30 is to provide stability in the PLL as it operates in a closed-loop manner. The bandwidth limited control voltage 32B is typically directed to the VCO 35 and is used by the VCO 35 as the basis for the frequency of the local sampling clock 40 that it generates.

According to the present invention, the width of the up and down pulses must not be diminished below a critical value. This critical value is dictated by the design of the D/A converter and defines the minimum width where the linearity of the D/A conversion process is not adversely affected. In many cases, the minimum width may be selected according to worst-case linearity requirements for a data and clock extraction system. Hence, the scope of the present invention should not be limited to those embodiments where the down pulse are maintained at approximately 1.5 UI and the up pulses are varied between one and 2 UIs.

The local sampling clock 40 may be used as a recovered clock signal that is synchronous with the data bit stream present in the encoded data stream 5. The PLL may be augmented by a simple delay flip-flop 45. Hence, a data extraction unit may comprise a PLL according to the present invention together with a delay flip-flop 45. In such a configuration, the encoded data signal 5 is routed to the input of the delay flip-clock 45. The encoded data signal 5 may be sampled coincident with the recovered clock, i.e. the local sampling clock 40, in order to extract the data bit stream encoded therein.

Figure 2:
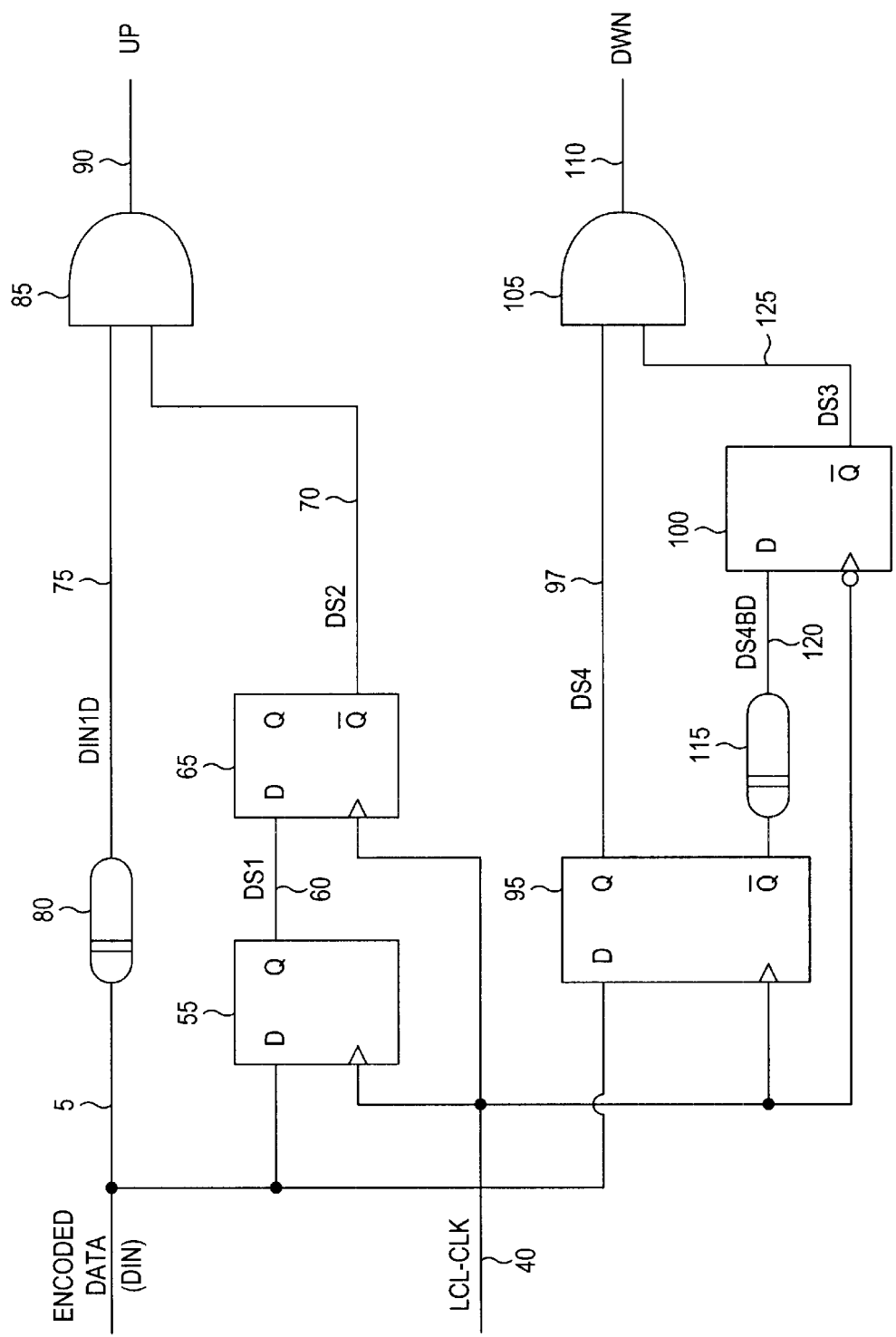
FIG. 2 is a schematic representation of one example of a phase detector 10 according to the present invention.

FIG. 2 is a schematic representation of one example of a phase detector 40 according to the present invention. In this example embodiment, up pulses 90 are generated by an AND gate 85. The AND gate 85 typically comprises two inputs. The first input to the AND gate 85 receives a delayed rendition of the encoded data signal 5. This delayed, encoded data signal may be referred to as "DIN1D" 75. The delayed encoded data signal DIN1D is typically generated by subjecting the encoded data signal 5 to a delay line 80. The amount of delay introduced by the delay line 80 typically comprises an amount of time equivalent to the amount of time necessary for a flip-flop to generate a stable output signal after its samples its input signal coincident with some clock signal. This type of delay is typically referred to as a "clock-to-output" propagation delay. In one example embodiment, the clock-to-output of a second flip-flop 65, infra, may be approximated by the delay line 80.

According to this example embodiment of the present invention, the encoded data signal 5 may be presented to a first flip-flop 55. The first flip-flop 55 samples the encoded data signal 5 coincident with the local sampling clock 40. This once-sampled encoded data signal may be referred to as "DS1" 60. The once-sampled encoded data signal DS1 is sampled by a second flip-flop 65 coincident with the local sampling clock 40 to create an inverted, twice-sampled encoded data signal DS2 70. The inverted, twice-sampled encoded data signal DS2 70 is directed to the second input of the AND gate 85 to generate up pulses 90.

Figure 3:
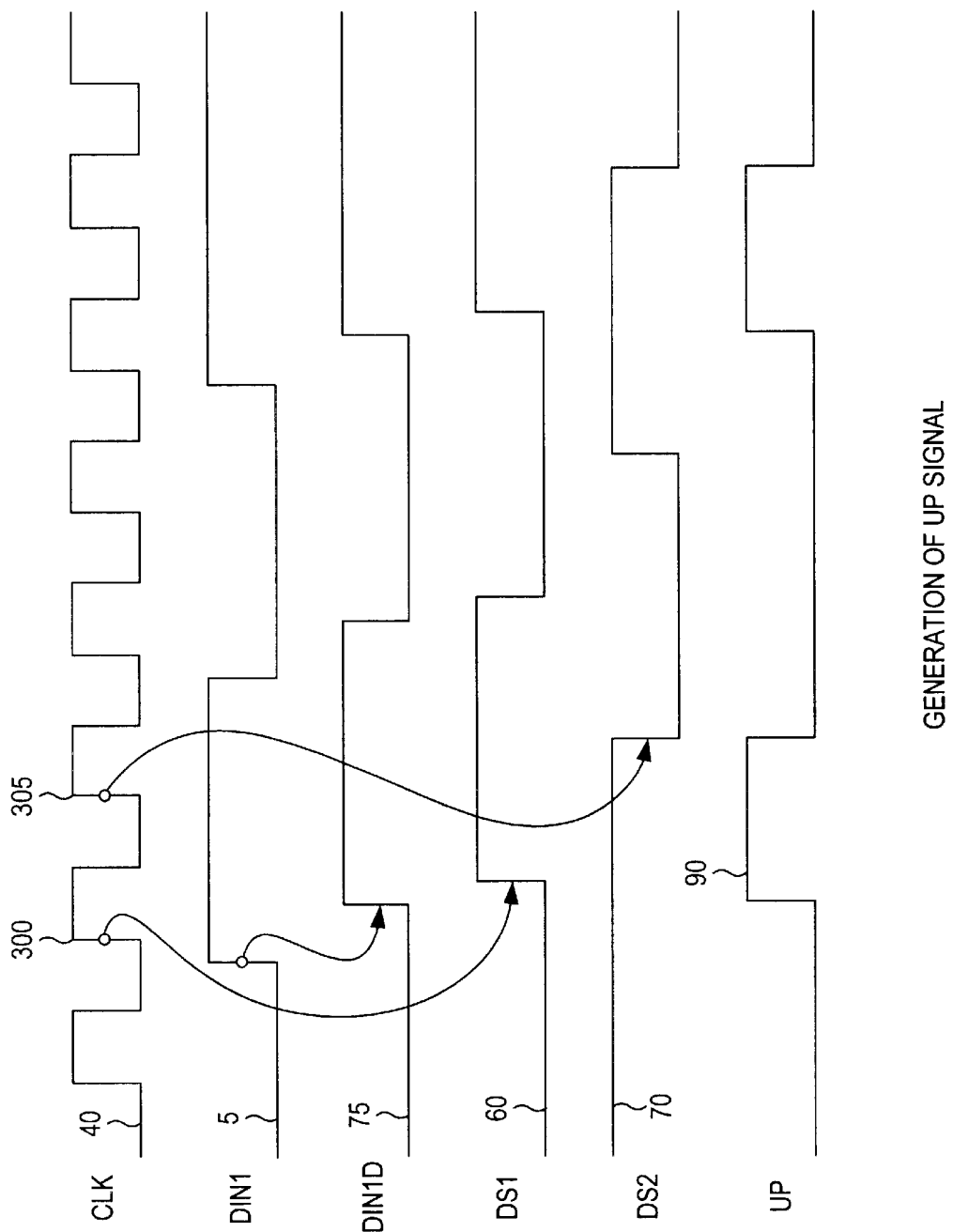
FIG. 3 is a timing diagram representative of the creation of up pulses according to one example embodiment of the present invention.

FIG. 3 is a timing diagram representative of the creation of up pulses according to one example embodiment of the present invention. According to this example embodiment, the local clock 40 is used to sample the encoded data signal 5. The encoded data signal may be referred to as "DIN1". A first rising clock transition 300 causes the state of the first flip-flop 55 to transition creating the once-sampled encoded data signal DS1 60. The second flip-flop 65 samples the output of the first flip-flop 55 at the second rising clock transition 305 of the local clock 40. This creates an inverted, twice-sampled encoded data signal DS2 70. The DS2 signal is directed to the second input comprising the AND gate 85.

FIG. 2 further depicts an illustrative circuit example for generation of a down pulse according to one example embodiment of the present invention. The down pulse 110 may be generated by an AND gate 105 comprising two inputs. A first flip-flop 95 may be used to sample the encoded data signal 5 coincident with the local sampling clock 40. This once-sampled encoded data signal is referred to as DS4 97. The DS4 signal 97 is directed to the first input comprising the AND gate 105. The inverse of the once-sampled encoded data signal may be subjected to a delay by a delay line 115 to generate a delayed, once-sampled encoded data signal DS4BD 120. According to this example embodiment, the DS4BD signal 120 is sampled coincident with the inverse of the local sampling clock 40 to generate a signal called DS3. The amount of delay introduced by the delay line 115 must be sufficient to allow the state of the DS3 signal to be generated as a result of the second occurrence of the inverse of the sampling clock 40 after the state of the encoded data signal is sampled. The DS3 signal may be directed to the second input comprising the AND gate 105.

Figure 4:
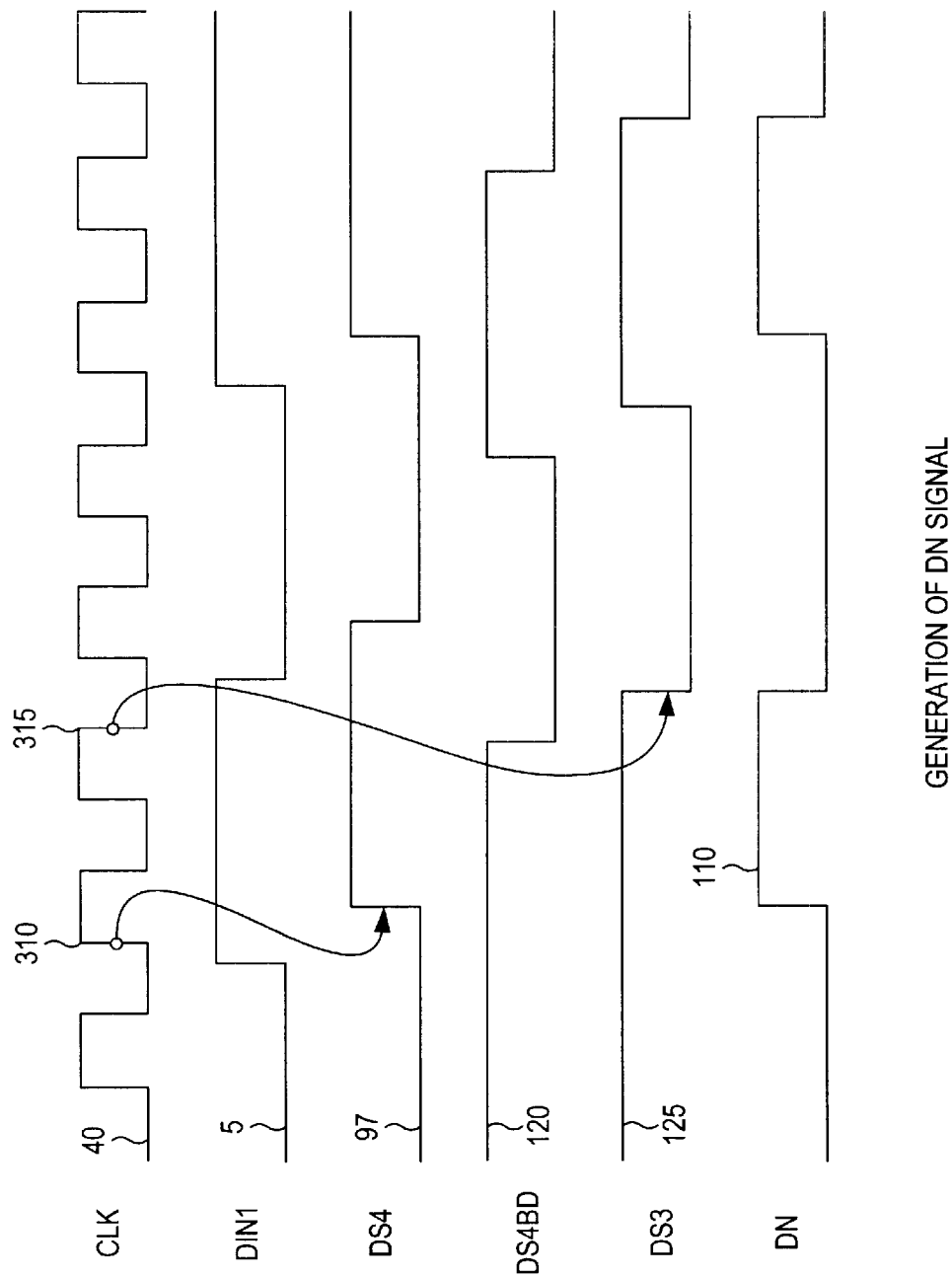
FIG. 4 is a timing diagram that illustrates how a down pulse may be generated according to one example embodiment of the present invention.

FIG. 4 is a timing diagram that illustrates how a down pulse may be generated according to one example embodiment of the present invention. The local sampling clock 40 is used to sample the encoded data signal 5. A first rising edge 310 of the local sampling clock 40 is used to sample the state of the encoded data signal 5. The output of this first flip-flop 55 comprises a signal referred to as DS4 97. The DS4 signal is directed to the first input comprising an AND gate 105. The inverse of the DS4 signal is delayed by a delay line 115 to ensure that it is sampled by a second flip-flop 100 on the second falling edge 315 of the local sampling clock following the rising edge 310 that was used to sample the encoded data signal DIN1 5. The output of the second flip-flop is referred to as a signal called DS3 125. The DS3 signal 125 is directed to the second input comprising the AND gate 105. The output of the AND gate comprises the down pulse 110.

The scope of the present invention is not intended to be limited to methods or apparatus that generate up pulses that vary between 1 and 2 UIs and down pulses that are maintained at approximately 1.5 UIs. The invention comprises embodiments that preclude the width of either the up or down pulse to diminish below a critical value dictated by linearity requirements. Typically, this critical minimum value is driven by design constraints in the D/A converter.

Figure 5:
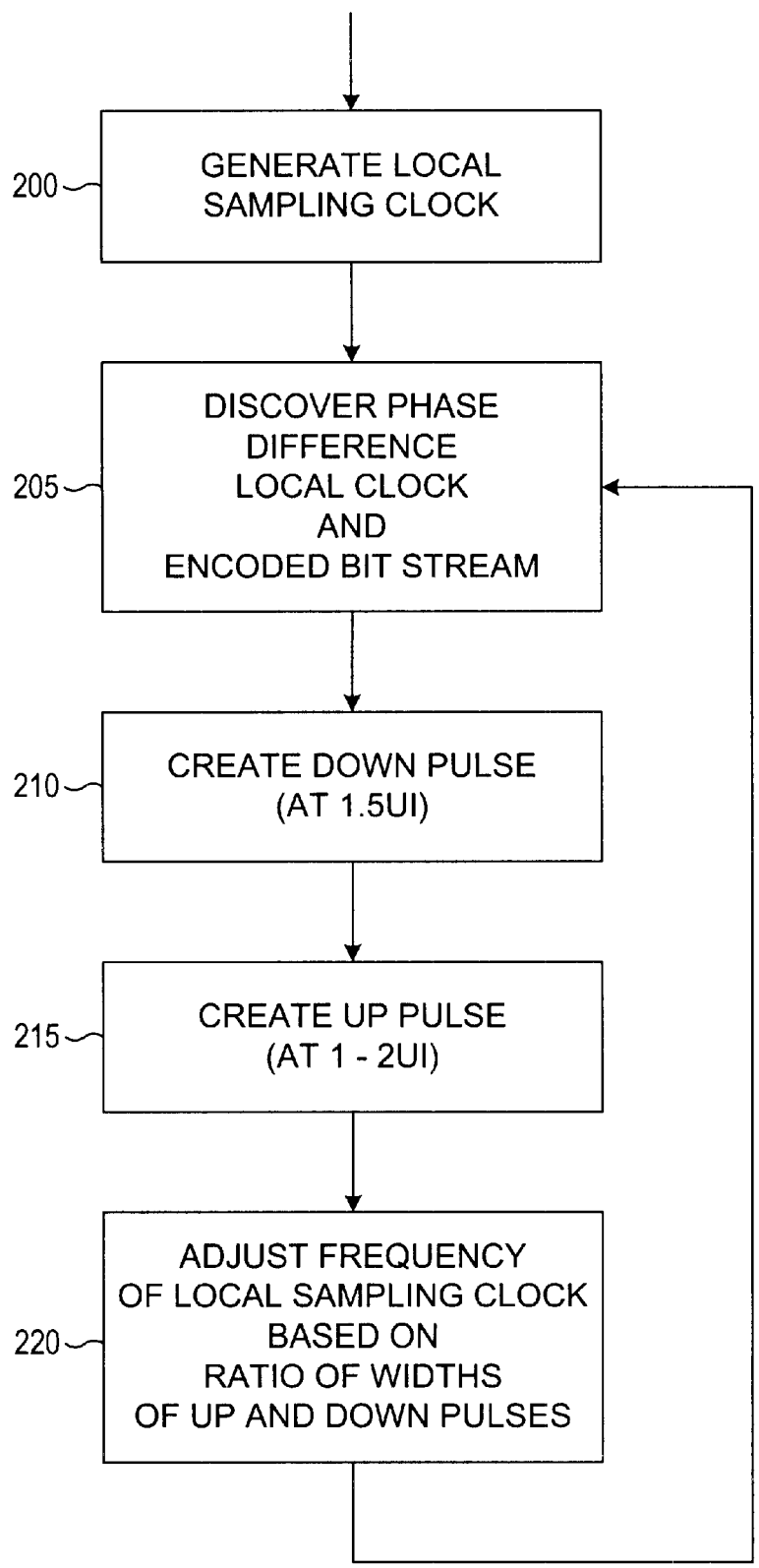
FIG. 5 is a flow diagram that depicts a one example method for extracting clock and data from an encoded data signal.

FIG. 5 is a flow diagram that depicts a one example method for extracting clock and data from an encoded data signal. This example method begins with a step that comprises generation of a local sampling clock (step 200). The phase of the local sampling clock is compared to the phase of the encoded bit stream to discover the phase relationship between the two signals (step 205). Based on the phase relationship between the local sampling clock and the encoded bit stream, up and down pulses are created.

In this example embodiment of the present invention, the down pulses are maintained at a width essentially equivalent to one and one-half times the unit interval of the local sampling clock (step 210). In this example embodiment, the up pulses are allowed to vary in width according to the phase relationship discovered in-step 205. The up pulses are allowed to vary between 1 UI and 2 UIs of the local sampling clock. The frequency of the local sampling clock is then adjusted based on the ratio of the width of the up and down pulses (step 220). Again, the salient characteristic of the width of either the up or down pulse is that of a minimum critical value for a desired PLL linearity performance and the scope of the present invention is not intended to be limited to that of any given illustrative embodiment.

Figure 6:
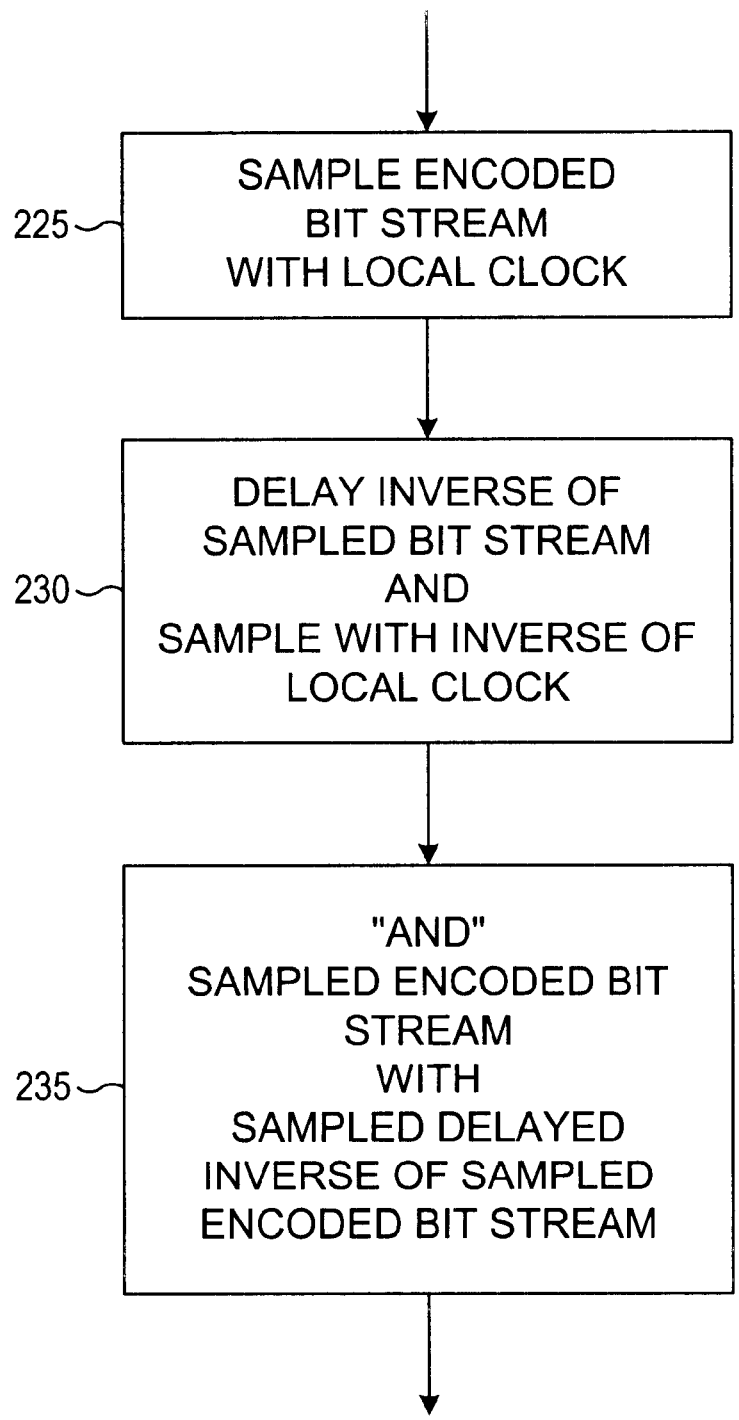
FIG. 6 is a flow diagram that depicts one example method for creating down pulses according to the present invention.

FIG. 6 is a flow diagram that depicts one example method for creating down pulses according to the present invention. According to this example method, an encoded bit stream may be sampled with a local clock (step 225). The inverse of the sampled encoded bit stream may then be delayed and then sampled with the inverse of the local clock (step 230). This sample of the inversed and delayed encoded bit stream may then be logically ANDed with the sampled encoded bit stream (step 235). In this example method, the inverse of the sampled encoded bit stream may be delayed so that the state of the encoded bit stream may be captured by the second incidence of the inverse of the local clock that occurs after the incidence of the local clock that was used to sample the encoded bit stream.

Figure 7:
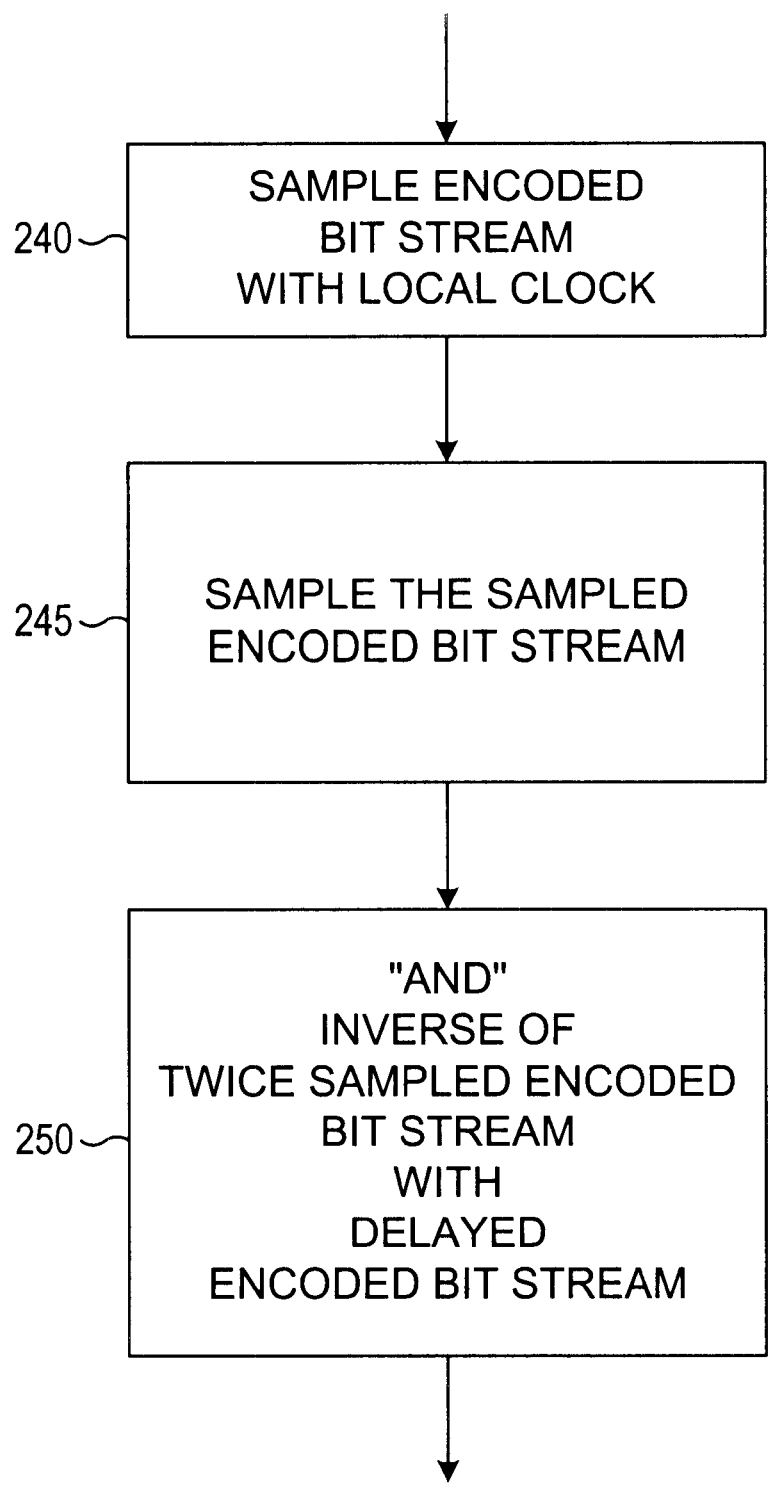
FIG. 7 is a flow diagram that illustrates one possible method for creating up pulses according to the present invention.

FIG. 7 is a flow diagram that illustrates one possible method for creating up pulses according to the present invention. In this illustrative method, the encoded bit stream may be sampled with a local clock (step 240). The sampled encoded bit stream may then again be sampled by the local clock (step 245). The up pulse may be created by logically ANDing the inverse of the twice-sampled encoded bit stream with the delayed encoded bit stream. According to this illustrative method, the delay imposed on the encoded bit stream may be approximately equal to the amount of time necessary to realize the sampled value of the twice-sampled encoded bit stream sampled coincident with the local clock.

Figure 8:
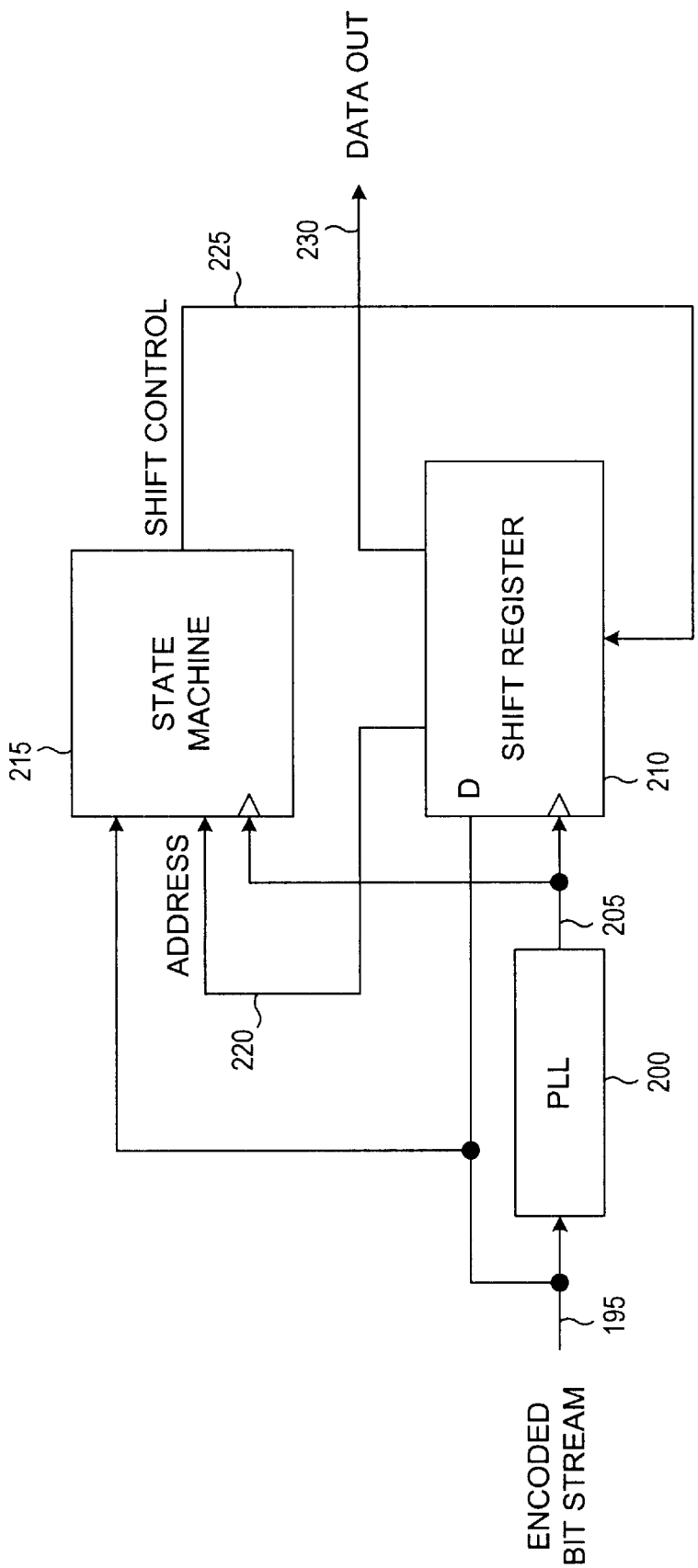
FIG. 8 is a block diagram that depicts one example embodiment of a data and clock extraction unit according to the present invention.

FIG. 8 is a block diagram that depicts one example embodiment of a data and clock extraction unit according to the present invention. The data and clock extraction unit comprises a PLL 200 and a data sampling unit that saves the state of an encoded bit stream coincident with a local clock generated by the PLL.

In this example embodiment, the PLL comprises a voltage controlled oscillator and a phase detector that generates up and down pulses according to the teachings of the present invention. As the PLL operates, the up and down pulses are used to drive a D/A converter. The D/A converter creates a control voltage that may be used by the voltage controlled oscillator to set the frequency of the local sampling clock. In some embodiments of the present invention, the D/A converter comprises a charge pump that generates a control voltage based on a ratio of the widths of the up and down pulses. In this example embodiment, the width of either the up pulses or the down pulses is limited to a minimum critical width commensurate with linearity requirements for the D/A converter.

The data sampling unit in some embodiments may comprise a simple delay flip-flop. In other embodiments, the data sampling unit may comprise a data reconstruction unit capable of collecting a plurality of data bits from an encoded data signal and creating data packets based on a predefined number of data bits.

One example embodiment of such a data reconstruction unit may comprise a shift register 210 that is controlled by a state machine 215. According to this example embodiment, the state machine may comprise a start detector that searches for a data packet start indicator in the stream of data bits arriving in the encoded bit stream 195. When the state machine 215 recognizes the start indicator, it asserts a control indicator 225 that enables the shift register 210 to collect a plurality of data bits from the encoded bit stream 195. The shift register 210 is typically clocked by the local sampling clock 205 generated by the PLL 200. In this example embodiment, the state machine 215 is sequenced by the local sampling clock 205 as well. The state machine may be sequenced by an external clock not necessarily synchronous with the PLL generated clock so long as the inputs to the state machine are properly synchronized to the sequencing clock.

The state machine 215 may further comprise a length counter. The length counter allows the shift register to capture a predetermined number of data bits from the encoded bit stream 195. Once the length counter reaches a terminal value, the shift control signal 225 may be de-asserted. This causes the shift register 210 to retain any data bits that were collected from the encoded bit stream 195 while the shift control indicator 225 was active.

In some embodiments of the present invention, the state machine 215 may further comprise an address comparison unit. The address comparison unit receives an address field 220 from the shift register 210. Once the length counter reaches its terminal value, the address comparison unit comprising the state machine 215 may issue a data ready signal 227 when the address field 220 received from the shift register 210 matches a preloaded register value. The data ready signal may indicate that the data packet received from the encoded bit stream 195 is available and is properly addressed.

Alternative Embodiments

While this invention has been described in terms of several preferred embodiments, it is contemplated that alternatives, modifications, permutations, and equivalents thereof will become apparent to those skilled in the art upon a reading of the specification and study of the drawings. It is therefore intended that the true spirit and scope of the present invention include all such alternatives, modifications, permutations, and equivalents.

What is claimed is:

1. A method for extracting clock and data from an encoded data bit stream comprising the steps of:
   generating a local sampling clock;
   discovering the difference between the phase of the local sampling clock and the phase of state transitions exhibited by the encoded data bit stream;
   creating a down pulse that is maintained at a width greater than a critical value dictated by linearity requirements for a D/A converter;
   creating an up pulse that varies in width and is precluded from diminishing in width below a critical value dictated by linearity requirements for a D/A converter; and
   adjusting the frequency of the local sampling clock in relation to the ratio of the width of the down pulse and the up pulse.

2. The method of claim 1 wherein:
   the down pulse is maintained in width approximately equal to 1.5 unit intervals of the local sampling clock and
   the up pulse varies in width approximately between 1 unit interval and 2 unit intervals of the local sampling clock according to the discovered phase difference.

3. The method of claim 2 further comprising the step of sampling the encoded data bit stream coincident with the local sampling clock in order to extract data from the encoded data bit stream.

4. The method of claim 2 wherein the step of creating a down pulse comprises the steps of:
   sampling the encoded bit stream coincident with the local clock;
   sampling a delayed inverse of the sampled encoded bit stream coincident with the inverse of the local clock wherein the inverse of the sampled encoded bit stream is delayed beyond the first incidence of the inverse of the local clock occurring after the incidence of the local clock used to sample the encoded bit stream; and
   logically ANDing the sampled encoded bit stream with the sampled delayed inverse of the sampled encoded bit stream.

5. The method of claim 2 wherein the step of creating an up pulse comprises the steps of:
   sampling the encoded bit stream coincident with the local sampling clock;
   sampling the sampled encoded bit stream coincident with the local sampling clock to create a twice-sample encoded bit stream; and
   ANDing a delayed encoded bit stream with the inverse of the twice-sampled encoded bit stream wherein the encoded bit stream is delayed in time by approximately the time necessary to realize the sampled value of the encoded bit stream.

6. The method of claim 2 wherein the step of adjusting the frequency of the local sampling clock comprises the steps of:
   creating a control voltage proportional to the width of the down and up pulses; and
   generating a clock whose frequency is determined by the control voltage.

7. A phase-locked-loop comprising:
   voltage controlled oscillator that generates a local clock based on a control voltage;
   phase detector that receives an encoded bit stream and the local clock and generates a down pulse that is maintained in width and is precluded from narrowing in width below a critical value dictated by linearity requirements for a digital-to-analog converter and generates an up pulse that varies in width according to the difference in phase between the local clock and state transitions exhibited by the encoded bit stream and is precluded from narrowing in width below a critical value dictated by linearity requirements for a digital-to-analog converter; and
   digital to analog converter that generates the control voltage based on the ratio of the widths of the up and down pulses and that is used as the basis for the frequency of the local clock generated by the voltage controlled oscillator.

8. The phase-locked-loop of claim 7 wherein:
   the down pulse that is maintained in width approximately equal to 1.5 unit interval of the local sampling clock and
   the up pulse varies in width approximately between 1 unit interval and 2 unit intervals of the local sampling clock according to the difference in phase between the local clock and state transitions exhibited by the encoded bit stream.

9. The phase-locked-loop of claim 8 wherein the phase detector comprises a down pulse generator comprising:
   first sampling unit that saves the state of the encoded data signal coincident with the local clock;
   delay unit that delays the inverse of the state saved by the first sampling unit beyond the first incidence of the inverse of the local clock occurring after the incidence of the local clock used by the first sampling unit to save the state of the encoded data signal;
   second sampling unit that saves the state of the delayed inverse of the state saved by the first sampling unit coincident with the inverse of the local sampling clock; and
   AND gate that logically ANDs the state of the encoded bit stream saved by the first sampling unit with the state of the delayed inverse of the sampled encoded bit stream saved by the second sampling unit.

10. The phase-locked-loop of claim 8 wherein the phase detector comprises an up pulse generator comprising:

first sampling unit that saves the state of the encoded data signal coincident with the local clock;

second sampling unit that saves the state saved by the first sampling unit coincident with the local clock;

delay unit that delays the encoded data signal by an amount of time approximate to that necessary for the second sampling unit to realize the state of the encoded data signal coincident with the local clock;

AND gate that logically ANDs the inverse of the state saved by the second sampling unit and the delayed encoded data signal.

11. A data and clock extraction unit comprising:

voltage controlled oscillator that generates a local clock based on a control voltage;

phase detector that receives an encoded bit stream and the local clock and generates a down pulse that is maintained in width and is precluded from narrowing in width below a critical value dictated by linearity requirements for a digital-to-analog converter and generates an up pulse that varies in width according to the difference in phase between the local clock and state transitions exhibited by the encoded bit stream and is precluded from narrowing in width below a critical value dictated by linearity requirements for a digital-to-analog converter;

digital to analog converter that generates the control voltage based on the ratio of the widths of the up and down pulses and that is used as the basis for the frequency of the local clock generated by the voltage controlled oscillator; and data sampling unit that saves the state of the encoded bit stream coincident with the local clock as a bit of data.

12. The data and clock extraction unit of claim 11 further comprising:

data reconstruction unit that receives a plurality of data bits from the data sampling unit and constructs data packets comprising a defined plurality of data bits.

13. The data and clock extraction unit of claim 12 wherein the data reconstruction unit comprises:

state machine that comprises:

start detector that receives a stream of data bits from the data sampling unit and searches for a data packet start indicator in said stream and asserts an acquisition signal when a data start packet indicator is recognized; and length counter that counts a predetermined number of bits received after the acquisition signal is asserted and then de-asserts the acquisition signal; and shift register that receives a stream of data bits from the data sampling unit and stores the bits sequentially so long as the acquisition signal is asserted.

14. The data and clock extraction unit of claim 13 wherein the state machine further comprises an address comparison unit that receives an address field from the shift register and issues a data ready signal if the address received from the shift register is equal to one or more predefined addresses.

15. The data and clock extraction unit of claim 11 wherein:

the down pulse that is maintained in width approximately equal to 1.5 unit interval of the local sampling clock and the up pulse varies in width approximately between 1 unit interval and 2 unit intervals of the local sampling clock according to the difference in phase between the local clock and state transitions exhibited by the encoded bit stream.

16. The data and clock extraction unit of claim 15 wherein the phase detector comprises a down pulse generator comprising:

first sampling unit that saves the state of the encoded data signal coincident With the local clock;

delay unit that delays the inverse of the state saved by the first sampling unit beyond the first incidence of the inverse of the local clock occurring after the incidence of the local clock used by the first sampling unit to save the state of the encoded data signal;

second sampling unit that saves the state of the delayed inverse of the state saved by the first sampling unit; and AND gate that logically ANDs the state of the encoded bit stream saved by the first sampling unit with the state of the delayed inverse of the sampled encoded bit stream saved by the second sampling unit.

17. The data and clock extraction unit of claim 15 wherein the phase detector comprises an up pulse generator comprising:

first sampling unit that saves the state of the encoded data signal coincident with the local clock;

second sampling unit that saves the state saved by the first sampling unit coincident with the local clock;

delay unit that delays the encoded data signal by an amount of time approximate to that necessary for the second sampling unit to realize the state of the encoded data signal coincident with the local clock;

AND gate that logically ANDs the inverse of the state saved by the second sampling unit and the delayed encoded data signal.

* * * * *